(12) United States Patent
Lin et al.

(10) Patent No.: US 8,202,783 B2
(45) Date of Patent: Jun. 19, 2012

(54) PATTERNABLE LOW-K DIELECTRIC INTERCONNECT STRUCTURE WITH A GRADED CAP LAYER AND METHOD OF FABRICATION

(75) Inventors: Qinghuang Lin, Yorktown Heights, NY (US); Deborah A. Neumayer, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 141 days.

(21) Appl. No.: 12/569,200

(22) Filed: Sep. 29, 2009

(65) Prior Publication Data
US 2011/0074044 A1    Mar. 31, 2011

(51) Int. Cl.
*H01L 21/76* (2006.01)
(52) U.S. Cl. ........................................................ 438/421
(58) Field of Classification Search .................. 438/421
See application file for complete search history.

(56) References Cited

U.S. PATENT DOCUMENTS

| | | | |
|---|---|---|---|
| 4,371,605 A | 2/1983 | Renner | |
| 5,886,102 A | 3/1999 | Sinta et al. | |
| 5,939,236 A | 8/1999 | Pavelchek et al. | |
| 6,025,260 A | 2/2000 | Lien et al. | |
| 6,087,064 A | 7/2000 | Lin et al. | |
| 6,100,559 A | 8/2000 | Park | |
| 6,214,719 B1 | 4/2001 | Nag | |
| 6,455,416 B1 | 9/2002 | Subramanian et al. | |
| 6,492,256 B2 | 12/2002 | Lee et al. | |
| 6,492,732 B2 | 12/2002 | Lee et al. | |
| 6,514,667 B2 | 2/2003 | Angelopoulos et al. | |
| 6,566,019 B2 | 5/2003 | Kling et al. | |
| 6,780,753 B2 | 8/2004 | Latchford et al. | |
| 6,787,469 B2 | 9/2004 | Houston et al. | |
| 6,805,109 B2 | 10/2004 | Cowan | |
| 6,861,180 B2 | 3/2005 | Chang | |
| 6,861,367 B2 | 3/2005 | Gilton et al. | |
| 7,041,748 B2 | 5/2006 | Lin et al. | |
| 7,056,840 B2 | 6/2006 | Miller et al. | |
| 7,064,078 B2 | 6/2006 | Liu et al. | |

(Continued)

FOREIGN PATENT DOCUMENTS

CA    1204547    5/1986

(Continued)

OTHER PUBLICATIONS

U.S. Appl. No. 12/126,287 entitled, "Photopatternable Dielectric Materials for BEOL Applications and Methods for Use", filed May 23, 2008, first named inventor: Robert D. Allen.

(Continued)

*Primary Examiner* — Jenny L Wagner
(74) *Attorney, Agent, or Firm* — Scully, Scott, Murphy & Presser, P.C.; Daniel P. Morris, Esq.

(57) ABSTRACT

An interconnect structure is provided that includes at least one patterned and cured low-k material located on a surface of a patterned graded cap layer. The at least one cured and patterned low-k material and the patterned graded cap layer each have conductively filled regions embedded therein. The patterned and cured low-k material is a cured product of a functionalized polymer, copolymer, or a blend including at least two of any combination of polymers and/or copolymers having one or more acid-sensitive imageable groups, and the graded cap layer includes a lower region that functions as a barrier region and an upper region that has antireflective properties of a permanent antireflective coating.

16 Claims, 2 Drawing Sheets

U.S. PATENT DOCUMENTS

| | | |
|---|---|---|
| 7,071,532 B2 | 7/2006 | Geffken et al. |
| 7,091,611 B2 | 8/2006 | Ahn et al. |
| 7,138,329 B2 | 11/2006 | Lur et al. |
| 7,253,095 B2 | 8/2007 | Lur et al. |
| 7,306,853 B2 | 12/2007 | Lin et al. |
| 7,944,055 B2 * | 5/2011 | Allen et al. .................. 257/758 |
| 2001/0016412 A1 | 8/2001 | Lee et al. |
| 2002/0012876 A1 | 1/2002 | Angelopoulos et al. |
| 2002/0163082 A1 | 11/2002 | Lee et al. |
| 2003/0073028 A1 | 4/2003 | Kim et al. |
| 2003/0129531 A1 | 7/2003 | Oberlander et al. |
| 2003/0198877 A1 | 10/2003 | Pfeiffer et al. |
| 2004/0048194 A1 | 3/2004 | Breyta et al. |
| 2004/0094821 A1 | 5/2004 | Lur et al. |
| 2004/0151489 A1 | 8/2004 | Zhou |
| 2005/0093158 A1 | 5/2005 | Liu et al. |
| 2005/0263896 A1 | 12/2005 | Lur et al. |
| 2006/0228895 A1 | 10/2006 | Chae et al. |
| 2007/0003841 A1 | 1/2007 | Choi |
| 2007/0020565 A1 | 1/2007 | Koh et al. |
| 2007/0054198 A1 | 3/2007 | Park |
| 2007/0148968 A1 | 6/2007 | Kwon et al. |
| 2007/0212649 A1 | 9/2007 | Lalbahadoersing et al. |
| 2007/0248899 A1 | 10/2007 | Choi |
| 2008/0150091 A1 * | 6/2008 | Lin .............................. 257/635 |
| 2008/0173984 A1 | 7/2008 | Lin et al. |
| 2008/0286467 A1 | 11/2008 | Allen et al. |
| 2009/0079075 A1 | 3/2009 | Lin et al. |
| 2009/0079076 A1 | 3/2009 | Lin et al. |
| 2009/0081418 A1 | 3/2009 | Allen et al. |
| 2009/0174067 A1 * | 7/2009 | Lin .............................. 257/734 |
| 2009/0233226 A1 | 9/2009 | Allen et al. |

FOREIGN PATENT DOCUMENTS

| | | |
|---|---|---|
| JP | 1293339 | 11/1989 |
| WO | WO2009037119 | 3/2009 |

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

International Search Report dated Sep. 27, 2010.

* cited by examiner

PATTERNABLE LOW-K DIELECTRIC INTERCONNECT STRUCTURE WITH A GRADED CAP LAYER AND METHOD OF FABRICATION

FIELD OF THE INVENTION

The present disclosure generally relates to interconnect structures and methods of fabricating the same. Specifically, the present disclosure provides single-damascene and dual-damascene low-k interconnect structures each including at least one cured product of a patternable low-k dielectric located on a graded cap layer and methods of fabricating the same.

BACKGROUND OF THE INVENTION

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to increase the aspect ratio (i.e., height to width ratio) and to reduce the dielectric constant, k, of interlayer dielectric (ILD) materials used to electrically insulate metal conductive lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps, which are described in greater detail in the following paragraphs.

When fabricating integrated circuit wiring within a multi-layered scheme, an insulating or dielectric material, e.g., silicon oxide or a low-k insulator will normally be patterned with several thousand openings to create conductive line openings and/or via openings using photo patterning and plasma etching techniques, e.g., photolithography with subsequent etching by plasma processes.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k dielectrics exhibit fundamentally weaker electrical and mechanical properties as compared to silicon oxide. Moreover, the low-k dielectric alternatives are typically susceptible to damage during the various interconnect processing steps. The damage observed in the low-k dielectric materials is manifested by an increase in the dielectric constant and increased moisture uptake, which may result in reduced performance and device reliability.

One way to overcome the integration challenges of low-k materials is to protect these low-k dielectric materials by adding at least one sacrificial hardmask layer onto a surface of the low-k dielectric material. While the hardmask layer serves to protect the low-k material, the presence of the sacrificial hardmask layer adds enormous process complexity as more film deposition, pattern transfer etch, and removal of hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure. For example, a via-first LTO integration for forming a dual-damascene interconnect includes the steps of: depositing a dielectric material on a substrate including a patterned conductor; forming at least one via in the dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of films are not needed in the final interconnect structure.

Although immensely popular in semiconductor manufacturing, the prior art dual-damascene integration scheme described above suffers from several drawbacks including: First, it constitutes a signification portion of manufacturing cost of advanced semiconductor chips as many layers, up to twelve layers for the state-of-the-art chips, are required to connect the minuscule transistors within a chip and to the printed circuit board. Second, it is a main yield detractor as the many layers of films required to form the interconnects generate chances for defect introduction and, thus, degrade manufacturing yields. Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating. Fourth, the performance gain by introduction of new lower-k materials is often offset by the needs for higher-k non-sacrificial materials, such as a cap layer, a hardmask layer, or a thicker copper barrier layer. Fifth, the prior art complex dual-damascene process lengthens manufacturing turn-around time and R&D development cycle. Sixth, the plasma etching process is an expensive and often unreliable process and requires significant up-front capital investment.

In view of the above, there is a need to simplify the formation of interconnects (single-damascene and dual-damascene) including low-k dielectrics for cost-saving and manufacturing efficiency.

SUMMARY

The problems described above in prior art processes of fabricating interconnect (single-damascene and dual-damascene) structures are solved by using a dramatically simplified integration method of this invention. The present invention thus relates to a method of forming interconnect structures that are a permanent part of integrated circuits and microelectronic devices with patternable low-k dielectrics combined with a graded cap layer. The graded cap layer, which is present between a substrate and an overlying patternable low-k dielectric material, includes a lower region that functions as a barrier layer, and an upper region that has properties of a permanent antireflective coating. At least one middle region is located between the upper and lower regions of the graded cap layer. The graded cap layer described herein replaces a multilayered stack comprised of a dielectric cap and an antireflective coating (ARC) that is employed in prior processes integrating a patternable low-k material. The graded cap layer described herein provides a simpler film stack and thus solves profile degradation problem during an ARC/cap open process in the multilayered stack employed in prior art processes. Furthermore, a thinner graded cap layer described herein reduces the plasma etch process time used to open the cap layer, thus reducing potential plasma damage to the patternable low-k material.

The invention described herein also circumvents the prior art drawbacks of traditional BEOL integration by combining the functions of a photoresist and a dielectric material into one single material. This one material, called a photo-patternable low-k dielectric (or patternable low-k material for short), acts as a photoresist during the lithographic patterning process, and as such, no separate photoresist is required. After lithographic patterning, the patternable low-k dielectric is subsequently converted into a low-k material during a post patterning cure. In this way, the inventive method avoids plasma etching of low-k dielectric materials and the complex sacrificial film stack and processes required for patterning of low-k dielectric materials.

In one embodiment of the present invention, an interconnect structure is provided that includes at least one patterned and cured low-k material located directly on a surface of a patterned graded cap layer. The at least one patterned and cured low-k material and the patterned graded cap layer each have conductively filled regions embedded therein. The patterned and cured low-k material comprises a cured product of a patternable composition comprising a functionalized polymer, copolymer, or a blend including at least two of any combination of polymers and/or copolymers having one or more photo/acid-sensitive imageable groups. The graded cap layer includes a lower region that functions as a barrier layer and an upper region that has properties of a permanent antireflective coating. At least one middle region is located between the upper and lower regions. The at least one middle region is formed from a combination of precursors used in forming the upper and lower regions of the graded cap layer.

In another embodiment of the present invention, a dual-damascene interconnect structure is provided that includes a lower patterned and cured low-k material located directly on a patterned graded cap layer and an abutting upper patterned and cured low-k material located on the lower patterned and cured low-k material. The lower and upper patterned and cured low-k materials as well as the patterned graded cap layer each have conductively filled regions embedded therein. The patterned and cured upper and lower low-k materials are cured products of a same or different patternable composition comprising a functionalized polymer, copolymer, or a blend including at least two of any combination of polymers and/or copolymers having one or more photo/acid-sensitive imageable groups. The graded cap layer includes a lower region that functions as a barrier layer and an upper region that has properties of a permanent antireflective coating. At least one middle region is located between the upper and lower regions of the graded cap layer.

In another embodiment of the invention, an air-gap containing dual-damascene interconnect structure is provided that includes at least one airgap located within at least one patterned and cured patternable low-k material adjacent, but not directly abutting conductively filled regions also located within the at least one patterned and cured patternable low-k material.

In another embodiment of the invention, a method of fabricating an interconnect structure is provided that includes providing at least one patternable low-k material directly on a surface of graded cap layer. The at least one patternable low-k material is a patternable composition comprising a functionalized polymer, copolymer, or a blend including at least two of any combination of polymers and/or copolymers having one or more photo/acid-sensitive imageable groups, and the graded cap layer includes a lower region that functions as a barrier layer and an upper region that has properties of a permanent antireflective coating. At least one middle region is located between the upper and lower regions of the graded cap layer. At least one interconnect pattern is formed within the at least one patternable low-k material and the graded cap layer. The at least one interconnect pattern is formed without utilizing a separate photoresist material. The at least one patterned patternable low-k material is cured into a cured dielectric material having a dielectric constant of not more than 4.3. The at least one interconnect pattern is filled with an electrically conductive material.

In yet another embodiment of the invention, a method of fabricating a dual-damascene interconnect structure is provided that includes providing a first patternable low-k material directly on a surface of a graded cap layer. The first patternable low-k material is a patternable composition comprising a functionalized polymer, copolymer, or a blend including at least two of any combination of polymers and/or copolymers having one or more photo/acid-sensitive imageable groups, and the graded cap layer includes a lower region that functions as a barrier layer and an upper region that has properties of a permanent antireflective coating. At least one middle region is located between the upper and lower regions of the graded cap layer. First interconnect patterns are formed within the first patternable low-k material without a separate photoresist. A second patternable low-k material is provided on top of the first patterned low-k material having the first interconnect patterns. The second patternable low-k material has a same or different patternable composition as the first patternable low-k material. Second interconnect patterns are formed within the second patternable low-k material without a separate photoresist. A post patterning cure is applied to the first and the second patterned patternable low-k materials to convert them into cured low-k dielectric material or materials. At least one opening is provided in exposed portions of the graded cap layer, and the first and the second interconnect patterns and the opening within the graded cap layer are filled with an electrically conductive material.

In yet another embodiment of the invention, a method of fabricating a dual-damascene interconnect structure is provided as above except that the post patterning cure is applied after at least one opening has been provided in exposed portions of the graded cap layer, and the first and the second interconnect patterns and before the opening of the first and the second patternable low-k materials and the graded cap layer is filled with an electrically conductive material.

In yet another embodiment of the invention, a method of fabricating an air-gap containing dual-damascene interconnect structure is provided after forming the standard metal filled dual-damascene interconnect structure.

It is observed that the patternable low-k material used in the present invention becomes a permanent element of the interconnect structure after a curing step has been performed. It is also observed that the graded cap layer used in the present invention becomes a permanent element of the interconnect structure too.

DETAILED DESCRIPTION

The present invention, which provides interconnect structures including a patternable low-k material and a graded cap layer that serves as both a dielectric cap and an antireflective coating (ARC) and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

The invention disclosed herein circumvents profile degradation and plasma damage problems of prior art interconnect structure that are formed from a patternable low-k dielectric by utilizing a graded cap layer instead of a separate multilayered stack that includes a dielectric cap and an overlying ARC. Additionally, this invention circumvents the prior art drawbacks of traditional interconnect integration by using a patternable low-k material, which combines the functions of a photoresist and a dielectric material into one material. This patternable low-k material acts as a photoresist during the lithographic patterning process and, as such a separate photoresist is not required or used. It is noted that the patternable low-k materials employed are any materials possessing two functions; they act as a photoresist during a patterning process and are subsequently converted into a low-k dielectric during a post patterning cure process. The cured product of a patternable low-k material, therefore, can serve as a permanent on-chip dielectric insulator. The patternable low-k material can be deposited from a liquid phase or a gas phase. The terms "cure" or "curing" are used interchangeable to refer one of the processes selected from a thermal cure, an electron beam cure, an ultra-violet (UV) cure, an ion beam cure, a plasma cure, a microwave cure or a combination thereof. A "cured" product of a patternable low-k material is the product of the patternable low-k material after it has undergone one of the aforementioned cure processes. The "cured" product of a patternable low-k material is different from the patternable low-k material in chemical nature and physical, mechanical and electrical properties.

Figure 10:
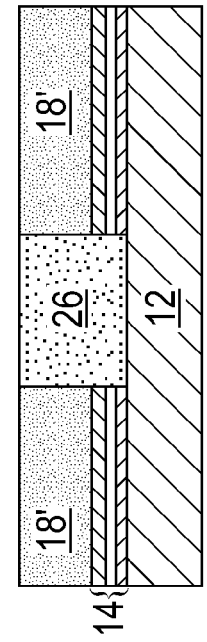
FIG. 10 is a pictorial representation (through a cross sectional view) of a single-damascene structure that can be formed utilizing the structure shown in FIG. 2 and subjecting that structure to interconnect patterning, conductive fill, and planarization.

One embodiment of the present invention will now be described in reference to FIGS. 1-8 which illustrate a preferred embodiment in which a dual-damascene interconnect structure including cured patternable low-k materials and a graded cap layer is formed. Although this preferred embodiment is described and illustrated, the method can be adopted to form single-damascene interconnect structures as well; See FIG. 10.

Figure 1:
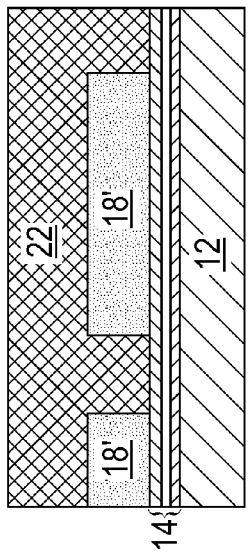
FIG. 1 is a pictorial representation (through a cross sectional view) illustrating an initial structure that is employed in one embodiment of the invention including a graded cap layer located on a surface of a substrate.

FIG. 1 illustrates an initial structure 10 that is utilized, which includes a substrate 12 and a graded cap layer 14 located on a surface of substrate 12. The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 12 is an electrically insulating material, the insulating material can be an organic insulator, an inorganic insulator or a combination thereof including multilayers. The substrate 12 can also include a patternable low-k dielectric material as well. These electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride or combinations thereof including multilayers. When the substrate 12 comprises a semiconducting material, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

The graded cap layer 14 that is formed directly on the surface of substrate 12 includes a lower region 14A and an upper region 14B; at least one middle, i.e., transition, region 14C can be present between the upper and lower regions. This at least one middle region 14C is formed by using different ratios of the precursors used in forming the lower region 14A and the upper region 14B. As such, the grading in composition within the graded cap layer is along the vertical direction relative to a surface of substrate 12.

The inventive graded cap layer 14 performs and enhances two essential functions for the integration of patternable low-k materials: an antireflective coating (ARC) function by the upper region 14B and a Cu barrier (cap) layer function by the lower region 14A. Since these two functions are imparted into the graded cap layer 14, the thickness of the graded cap layer 14 can be less than the combined thickness of the two separate ARC and cap layers. Moreover, this graded cap layer 14 eliminates the interface of the two layer structure. Therefore potential adhesion issues in the two layer structure can be avoided.

The upper region 14B of the graded cap layer should have the following general ARC characteristics: (i) It acts as an antireflective coating (ARC) during a lithographic patterning process. (ii) It withstands high-temperature BEOL integration processing (up to 500° C.); (iii) It prevents resist (e.g., the patternable low-k material) poisoning by the substrate; (iv) It provides vertical wall profile and sufficient etch selectivity between the patternable low-k material and the ARC layer; (v) It serves as a permanent dielectric layer in a chip (low dielectric constant, preferably k<5, more preferably k<3.6); and (vi) It is compatible with conventional BEOL integration and produces reliable hardware.

The lower region 14A of the graded cap layer should have the following general cap characteristics. That is, the lower region 14A of the graded cap layer 14 has properties of a dielectric cap: (1) It acts as an effective Cu diffusion barrier to prevent any adverse effect of diffusion of any chemicals that will degrade the electrical conductivity and reliability of the conductor, such as Cu or Cu alloys; (2) It enhances the electromigration reliability performance of the resultant interconnect structure or device; (3) It should provide at least adequate adhesion with its adjacent layers during the fabrication process and reliability testing. The lower region 14A of the graded cap layer 14 can comprise atoms of any dielectric cap material including atoms of Si and C; Si and N; Si and O; Si, O and N; atoms of Si, C and O; Si, C, O and H; and Si, C, N and H. Additionally, the lower region 14A of the graded cap 14 may include atoms of Ru, Co, W and P.

The graded cap layer 14 is formed utilizing a conventional gas phase deposition process such as, for example, chemical vapor deposition (CVD), plasma enhanced chemical vapor deposition (PECVD), and atomic layer deposition (ALD). In some embodiments, a liquid phase deposition process can be used in forming a portion of the graded cap layer 14. In forming the graded cap layer 14, a first precursor, i.e., a dielectric cap precursor, is used in forming the lower region of the graded cap layer, while a second precursor, i.e., an ARC precursor, is used in forming the upper region of the graded cap layer. In one embodiment, the graded cap layer is formed by at least three discrete regions: a bottom region that uses a cap precursor and a top region that uses an ARC precursor and a middle region that employs a mixture of both precursors. In another embodiment, the graded cap layer is a continuous layer with gradually varied composition along the vertical direction. This type of graded cap layer is formed by using both precursors at the same time and the various regions are formed by gradually altering the ratios of the two precursors.

The graded cap layer 14 typically has a thickness 2 nm to 200 nm, with a thickness from 10 nm to 100 nm being more typical.

The upper region 14B of the graded cap layer 14 has antireflective coating properties as described above. Further discussion is now provided for characteristics (i)-(v) of the upper region 14B of graded cap 14.

Characteristic (i), i.e., the upper region 14B of the graded cap layer 14 acts as an antireflective coating (ARC) during a lithographic patterning process: The upper region 14B of the graded cap layer 14 may be designed to control reflection of light that is transmitted through the patternable low-k material (to be subsequently formed), reflected off the substrate and back into the patternable low-k material, where it can interfere with incoming light and cause the patternable low-k material to be unevenly exposed (along the vertical direction). The optical constant of the upper region 14B of the graded cap layer 14 is defined here as the index of refraction n and the extinction coefficient k. In general, the upper region 14B of the graded cap layer 14 can be modeled so as to find optimum optical parameters (n and k values) of an ARC as well as optimum thickness. The preferred optical constants of the upper region 14B of the graded cap layer 14 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of the upper region 14B of the graded cap layer 14 are optimized to obtain optimal resolution and profile control of the patternable low-k material during the subsequent patterning steps, which is well known to those ordinarily skilled in the art.

Characteristic (ii), i.e., the upper region 14B of the graded cap layer 14 can withstand high-temperature BEOL integration processing (up to 500° C.): The graded cap layer 14, particularly the upper region 14B, must withstand the harsh processing conditions during BEOL integration. These include high temperature and intense UV curing. The process temperature can be as high as 450° C. The intensity of the light used in the UV cure process can be as high as tens of J/cm$^2$.

Characteristic (iii), i.e., the upper region 14B of the graded cap layer 14 prevents resist (e.g., patternable low-k material) poisoning by the substrate: The patternable low-k materials employed are preferably chemically amplified resists. They can be poisoned by any basic contaminant from the underlying substrate 12 or from the lower region 14A of the graded cap layer. As such, the upper region 14B of the graded cap layer 14 must serve as an additional barrier layer to prevent basic contaminant from the underlying substrate from diffusing into the patternable low-k material to poison the chemically amplified patternable low-k material.

Characteristic (iv), i.e., The upper region 14B of the graded cap layer 14 provides vertical wall profile and sufficient etch selectivity between the patternable low-k material and the graded cap layer 14: The upper region 14B of the graded cap layer 14 should provide sufficient reflectivity control with reflectivity from the underlying substrate under a particular lithographic wavelength of less than 8%, preferably less than 5%, more preferably less than 2% and generate vertical side wafer profile. The upper region 14B of the graded cap layer 14 should also generate residue-free patterns with no footing. Moreover, the adhesion of the patternable low-k material should be sufficient to prevent pattern collapse during patterning and a subsequent UV cure. The upper region 14B of the graded cap layer 14 should also be designed such that the etch selectivity during graded cap open process is sufficiently high so that the opening of the graded cap stack does not erode significant portion of the patternable low-k material and degrade significantly its pattern profile. An etch selectivity (etch rate ratio of graded cap versus patternable low-k material) is greater than 1, preferably greater than 3, more preferable greater than 5.

Characteristic (v), i.e., the upper region 14B of the graded cap layer 14 serves as a permanent dielectric layer in a chip: The graded cap layer 14 including the upper region 14B and the lower region 14A remains after patterning and cure of the patternable low-k material. It serves as a permanent dielectric layer in a chip. Therefore, the graded cap layer 14 including the upper region 14B (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (adhesion energy is equal to or greater than the cohesive energy of the weakest layer of the integrated film stack); must pass electrical and mechanical reliability tests.

The upper region 14B of the graded cap layer 14 may include atoms that are associated with inorganic antireflective coatings, such as, for example, atoms of Si, C, O, N and H, atoms of Si and C, atoms of Si, O and C, atoms of Si, C, O and H, atoms of W, Co, Ru, Ta, Ti, and Ru and the like.

In one embodiment, the upper region 14B of the graded cap layer 14 is an inorganic composition that includes atoms of M, C (carbon) and H (hydrogen), wherein M is selected from at least one atom of Si, Ge, B, Sn, Fe, Ta, Ti, Ni, Hf and La. This inorganic composition may optionally include atoms of O, N, S, F or mixtures thereof. In some embodiments, M is preferably Si. In some embodiments, this inorganic composition may also be referred to as a vapor deposited M:C:H:optionally X material, wherein M is as defined above, and X is at least one element of O, N, S and F.

In another embodiment, the graded cap layer is a graded silicon carbide nitride film deposited by PECVD method. To synthesize the graded silicon carbide nitride film, a combination of reactant gases: a silicon source, a carbon source, and a nitrogen source is necessary. Additionally the reactant gases must be introduced in varying stoichiometries to achieve the necessary properties. The gas mixture may also comprise an inert carrier gas such as helium or argon.

Within the present invention, the silicon containing precursor of an inorganic composition comprises any Si containing compound including molecules selected from silane ($SiH_4$) derivatives having the molecular formulas $SiR_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, cyclocarbosilanes.

Preferred silicon precursors include, but are not limited to: silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahythido-1,3,5-trisilane; 1,1,3,3,5,5-hexamethyl-1,3,5-trisilane; 1,1,1,4,4,4-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene.

A single precursor such as silane amine, $Si(Net)_4$, can be used as the silicon, carbon and nitrogen source. Another preferred method is a mixture of precursors, a silicon containing source such as silane, disilane, or an alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —[CH$_2$]$_n$—, where n is greater than or equal to 1, and may be substituted by functional groups selected from alkenes (—C═C—), alkynes (—C≡C—), amines (—C—N—), nitriles (—C≡N), amino (—NH2), azido (—N═N═N—) and azo (—N═N—) may also be required. Within the invention, the hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

The method of the present invention may further comprise the step of providing a parallel plate reactor, which has an area of a substrate chuck from about 85 cm$^2$ to about 750 cm$^2$, and a gap between the substrate and a top electrode from about 1 cm to about 12 cm. A high frequency RF power is applied to one of the electrodes at a frequency from about 0.45 MHz to about 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of a graded SiCN (H) film. Broadly, the conditions used for providing a SiCN (H) comprising elements of Si, C, N, H, include: setting the substrate temperature within a range from about 100° C. to about 700° C.; setting the high frequency RF power density within a range from about 0.1 W/cm$^2$ to about 2.0 W/cm$^2$; setting the gas flow rates within a range from about 5 sccm to about 10000 sccm, setting the inert carrier gases, such as helium (or/and argon) flow rate within a range from about 10 sccm to about 10000 sccm; setting the reactor pressure within a range from about 1 Torr to about 10 Torr; and setting the high frequency RF power within a range from about 10 W to about 1000 W. Optionally, a lower frequency power may be added to the plasma within a range from about 10 W to about 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from about 10 sccm to about 1000 sccm.

While gas precursors are used in the above example, liquid precursors may also be used for the deposition.

An example of the first method of the present invention is now described to make a SiCNH material: A 200 mm substrate is placed in a PECVD reactor on a heated wafer chuck at 200°-600° C. Any PECVD deposition reactor may be used within the present invention. Gas and liquid precursor flows are then stabilized to reach a pressure in the range from 1-10 Torr, and RF radiation is applied to the reactor showerhead for a time from about 5 to about 500 seconds.

In one preferred embodiment, the upper region 14B of graded cap layer 14 includes atoms of Si:C:H:X. These Si containing materials are deposited from at least one Si containing precursor. More particularly, the Si:C:H:X materials are deposited from at least one Si containing precursor with, or without, additions of nitrogen and/or oxygen and/or fluorine and/or sulfur containing precursors. The Si containing precursor that is employed may comprise any Si containing compound including molecules selected from silane ($SiH_4$) derivatives having the molecular formulas $SiR_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes. Preferred silicon precursors include, but are not limited to silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3-tetrahydrido-1,3-disilacyclobutane; 1,3-disilacyclobutane; 1,3-dimethyl-1,3-dihydrido-1,3-disilylcyclobutane; 1,1,3,3,tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene may be employed.

A single precursor such as silane amine, $Si(Net)_4$, can be used as the silicon, carbon and nitrogen source. Another preferred method is a mixture of precursors, a silicon containing source such as silane, disilane, or a alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —$[CH_2]_n$—, where n is greater than or equal to 1, and may be substituted by functional groups selected from alkenes (—C=C—), alkynes (—C≡C—), amines (—C—N—), nitriles (—C≡N), amino (—NH2), azido (—N=N=N—) and azo (—N=N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

The atomic % ranges for M in such materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in the upper region 14B are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in the upper region 14B are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in the upper region 14B are as follows: preferably O atomic % to 70 atomic %, more preferably 0.5 atomic % to 70 atomic %, most preferably 1 atomic % to 40 atomic % and most highly preferably 5 atomic % to 30 atomic %.

The upper region 14B of graded cap layer 14 including atoms of M, C and H has a tunable index of refraction and extinction coefficient which can be optionally graded along the film thickness to match the optical properties of the substrate and the patternable low-k material. The optical properties and the lithographic features of the upper region 14B of the graded cap layer 14 are vastly superior to those obtained by the prior art.

It should be noted that by changing process parameters such as bias voltage, gas mixture, gas flow, pressure and deposition temperature, the optical constant of the upper region 14B of the graded cap layer 14 can be changed. In addition, the composition of the starting precursor as well as the introduction of oxygen, nitrogen, fluorine, and sulfur containing precursors also allows the tunability of these films. The optical constants of the upper region 14B of graded cap layer 14 are defined here as the index of refraction n and the extinction coefficient k.

In another embodiment, upper region 14B of graded cap layer 14 is formed by a liquid deposition process including for example, spin-on coating, spray coating, dip coating, brush coating, evaporation or chemical solution deposition. This liquid deposited upper region 14B is formed by either depositing a film with ARC properties on a lower region 14A of the graded layer or by forming graded cap layer with a mixture comprising an ARC-like component through phase separation. This upper region 14B of graded cap layer 14 formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the upper region 14B of graded cap layer 14 formed by liquid deposition may also include at least one second monomer unit, in addition to the at least one monomer unit represented by the formula M-$R^A$. When present, the at least one second monomer unit has the formula M'-RB, wherein M' is at least one of the elements of Si, Ge, B, Sn, Fe, Ta, Ti, Ni, Hf and La, and $R^B$ is a cross-linking agent.

M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid composition comprising $M\text{-}R^A$ or $M\text{-}R^A$ and $M'\text{-}R^B$ may also comprise at least one additional component, including a separate crosslinker, an acid generator or a solvent.

When liquid deposition is employed, upper region 14B of graded cap layer 14 is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the upper region 14B may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of the inorganic composition used in the liquid deposition embodiment comprises $M\text{-}R^A$ and $M'\text{-}R^B$ units, wherein M and M' is at least one of the elements of Si, Ge, B, Sn, Fe, Ta, Ti, Ni, Hf and La or is selected from Group IIIB to Group VIB, Group IIIA, and Group IVA. The inorganic precursor used in forming the upper region 14B may optionally include elements of O, N, S, F or mixtures thereof. One embodiment of the upper region 14B composition comprises the $MO_y$ unit which can be any one of many different metal-oxide forms. An exemplary list of such metal-oxide forms for a particular metal is as follows: $MO_3$; wherein M is Sc, Y, lanthanide, and Group IIIA; B, Al, Ga or In; $MO_4$; wherein M is Group IVB; Ti, Zr or Hf, and Group IVA; Sn or Ge; $MO_5$; wherein M is Group VB; V, Nb or Ta; or P. The Group VB metals are also known to form stable metal oxo forms, LMO3, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited upper region 14B are defined in greater detail with respect to the following preferred embodiment of the present invention. In a preferred embodiment, the upper region 14B of graded cap layer 14 is formed by liquid deposition characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomer of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should have solution and film-forming characteristics conducive to forming an ARC-type layer by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

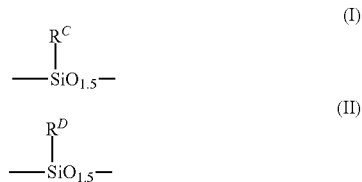

where $R^C$ comprises a chromophore and $R^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for $R^C$-containing monomers may be represented as structure (III) below and the average structure for $R^D$-containing monomers may be represented by structure (IV) below:

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups $R^C$ (or $R^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited upper region 14B is poly(4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly(p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly(p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in forming the liquid deposited upper region 14B of graded cap layer 14 preferably have a weight average molecular weight, before reaction with the cross-linking component, of at least 1000, more preferably a weight average molecular weight of 1000-10000.

The cross-linking component of the liquid deposited upper region 14B of graded cap layer 14 is preferably a crosslinker that can be reacted with the SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

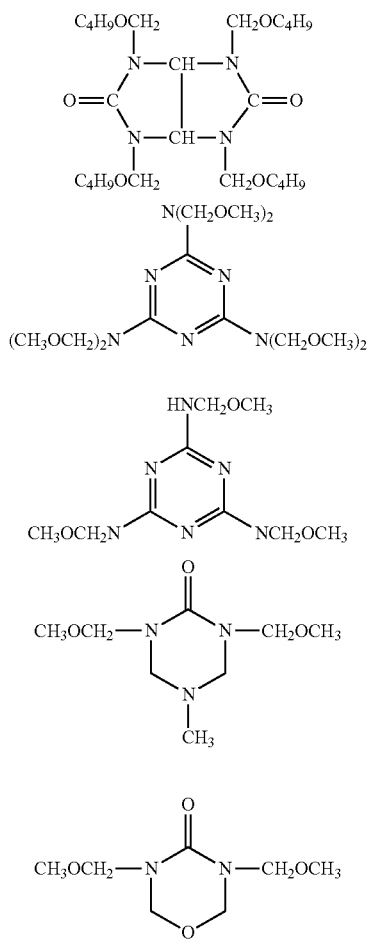

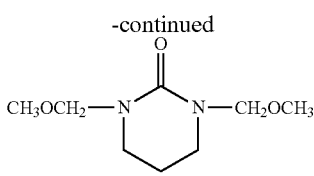

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction.

Even if a radiation-sensitive acid generator is used, it is preferred to thermally treat the composition to accelerate the cross-linking process (e.g., for wafers in a production line).

The compositions used in the liquid deposition process preferably contain (on a solids basis) (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

When the upper region 14B of graded cap layer 14 is formed by liquid deposition process any liquid deposition process including for example, spin-on coating, spray coating, dip coating, brush coating, evaporation or chemical solution deposition can be used. After liquid depositing the upper region 14B, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC 16 may further undergo a curing process. The curing is performed in the present invention by a thermal cure, an electron beam cure, an ultra-violet (UV) cure, an ion beam cure, a plasma cure, a microwave cure or any combination thereof.

The lower region 14A of the graded cap layer 14 can comprise atoms of any dielectric cap material including atoms of Si and C; Si and N; Si and O; Si, O and N; Si, C, O and H; and Si, C, N and H. Additionally, the lower region 14A of the graded cap layer 14 may include atoms of Ru, Co, W and P.

The lower region 14A of the graded gap later 14, which is formed prior to upper region 14B, can be formed utilizing a conventional deposition process such as, for example, chemical vapor deposition (CVD), plasma enhanced chemical vapor deposition (PECVD), atomic layer deposition (ALD), chemical solution deposition, or evaporation. The precursors used in forming the lower region 14A of the graded cap layer 14 include any conventional precursor that can be used in forming a discrete dielectric capping layer.

As stated above, the graded cap layer 14 can be formed by two general methods: (1) forming at least three discrete regions with the top region being the ARC-like layer deposited with an ARC precursor or a combination of ARC precursors, the bottom region deposited with a cap precursor or a combination of cap precursors, and at least one middle region with the combination of the ARC precursor and the cap precursor, and (2) forming a continuous layer with gradually varied composition along the vertical direction. Forming at least three discrete regions can be achieved by depositing these regions in one single deposition or a separate tool for each layer. Forming the continuous graded cap layer can be achieved by gradually varying the ratio of the cap precursor and the ARC precursor in the single tool with the lower regions 14A comprising mostly the cap precursor and upper region 14B comprising mostly the ARC precursor.

In some embodiments, the as-deposited graded cap layer 14 may be subjected to a post deposition treatment to improve the properties of the entire layer or the surface of graded cap layer 14. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the graded cap layer 14 and/or the film stack containing graded cap layer 14, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming graded cap layer 14.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few mJ/cm$^2$ to thousands of J/cm$^2$. This irradiation treatment can be conducted at ambient temperature or at an elevated temperature no higher than 500° C. This irradiation treatment can be conducted in an inert environment or within a chemical environment in a gas phase or a liquid phase. In one embodiment, the following conditions may be employed: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the graded cap layer 14.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the graded cap layer 14.

The post deposition chemical treatment may be conducted in a gas phase or a liquid phase. In one embodiment, the following conditions may be employed: a treatment time from 1 sec to 30 min, a temperature from room temperature to 500° C. Chemicals suitable for this chemical treatment may be selected from any chemicals that improve chemical, physical, electrical, and/or mechanical properties of graded cap layer 14 such as adhesion strength. This chemical treatment may penetrate the entire graded cap layer 14 or is limited only to the surface of the graded cap layer 14. Example chemicals include adhesion promoters such as, for example, silanes, siloxanes, and silylation agents. This treatment step may or may not be performed in the same tool as that used in forming the graded cap layer 14.

Examples of such post deposition treatments are disclosed, for example, in U.S. Patent Application Publication No. 2008/0173984, the entire content which is incorporated herein by reference.

Figure 2:
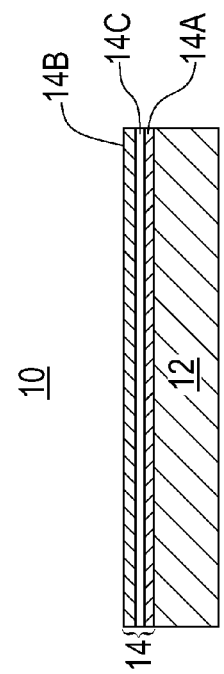
FIG. 2 is a pictorial representation (through a cross sectional view) of the structure shown in FIG. 1 after forming a first patternable low-k material directly on an upper surface of the graded cap layer.

Referring to FIG. 2, a first patternable low-k material 18, which combines the function of a photoresist and low-k dielectric into one single material is provided directly on the surface of the graded cap layer 14. The first patternable low-k material 18 is provided (i.e., formed) utilizing a deposition process including, for example, spin-on-coating, dip coating, brush coating, blade coating, and ink jet dispensing. After applying the first patternable low-k material 18, a post deposition baking step is typically, but not necessarily always, required to remove unwanted components, such as solvent. When performed, the baking step can be conducted at a temperature from 40° C. to 200° C., with a baking temperature from 60° C. to 140° C. being even more preferred. The duration of the baking step varies from 10 seconds to 600 seconds and is not critical herein.

The thickness of the first patternable low-k material 18 may vary depending on the requirement of the chip and the technique used to form the same as well as the material make-up of the layer. Typically, the first patternable low-k material 18 has a thickness from 1 nm to 50000 nm, with a thickness from 20 nm to 5000 nm being more typical.

As stated above, the first patternable low-k material 18 functions as a photoresist and is converted into a low-k material during post patterning processing, by heat, UV light, electron beam, ion beam, microwave, plasma cure, thermal cure or combinations thereof. For instance, the first patternable low-k material 18 may be a patternable composition comprising a functionalized polymer, copolymer, or a blend including at least two of any combination of polymers and/or copolymers having one or more acid-sensitive imageable groups. This patternable composition can be converted into a low-k material after subsequent processing. It is noted that when the patternable low-k material 18 is comprised of a polymer, the polymer includes at least one monomer (to be described in greater detail below). When the patternable low-k material 18 is comprised of a copolymer, the copolymer includes at least two monomers (to be described in greater detail below). The blends of polymers and/or copolymers include at least two of any combination of polymers and/or copolymers described below.

In general terms, the patternable low-k material that can be employed as layer 18 is a patternable composition comprising a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the first patternable low-k material 18 is patternable composition comprising a photo/acid-sensitive polymer of one monomer or a copolymer of at least two monomers selected from siloxane, silane, carbosilane, oxycarbosilane, organosilicates, silsesquioxanes and the like. The first patternable low-k material 18 may also be patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the patternable low-k dielectric material 18 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the first patternable low-k material 18 may be patternable composition further comprising at least one microscopic pore generator (porogen). The pore generator may be or may not be photo/acid sensitive. By "photo/acid sensitive" it means that this porogen is sensitive to light and/or acid such that the porogen itself is patternable or enhances the resolution and/or the pattern quality of the patternable low-k material. This pore generator has these attributes: (1) is compatible with the other components of the patternable low-k composition, i.e., without phase separation after coating and other processing; (2) can be patterned with standard lithographic techniques as part of the patternable low-k composition; and (3) can be removed during the post patterning cure process to generate microscopic pores, thus lowering the dielectric constant of the cured patternable low-k material. The pore size (diameter) should be less than 10 nm, preferably less than 5 nm, and more preferably less than 2 nm.

Illustrative polymers for the patternable low-k material 18 include, but are not limited to, siloxane, silane, carbosilane, oxycarbosilane, silsesquioxane-type polymers including caged, linear, branched or combinations thereof. In one embodiment, the first patternable low-k material 18 is a patternable composition comprising a blend of these photo/acid-sensitive polymers. Examples of patternable low-k materials useable with the present disclosure are disclosed in U.S. Pat. Nos. 7,041,748, 7,056,840, and 6,087,064, as well as U.S. Patent Application Publication No. 2008/0286467, U.S. Patent Application Publication No. 2009/0233226, and U.S. patent application Ser. No. 12/126,287, filed May 23, 2008, all of which are incorporated herein by reference in their entirety. The dielectric constant of the patternable low-k material 18 after cure is generally no more than 4.3. The dielectric constant may be greater than 1 and up to 4.3, more preferably from 1 to 3.6, even more preferably from 1 to 3.0, further more preferably from 1 to 2.5, with from 1 to 2.0 being most preferred.

The first patternable low-k material 18 is formed from a patternable composition that includes at least one of the above mentioned polymers, copolymers or blends, a photoacid generator, a base additive and a solvent typically used in a photoresists. When the first patternable low-k material 18 is a negative-tone patternable low-k material, it may be formed from a patternable composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the first patternable low-k material 18 is a positive-tone patternable low-k material, it is formed from a patternable composition that includes at least one of the above mentioned polymers, copolymers or blends, a photoacid generator, a base additive and a solvent typically used in a photoresists. The photoacid generators, base additives and solvents are well known to those skilled in the art and, as such, details regarding those components are not fully provided.

In a preferred embodiment, the first patternable low-k material 18 is a chemically amplified positive-tone or negative-tone patternable low-k material that comprises a silsesquioxane polymer or copolymer or a blend of at least two of any combination of polymers and/or copolymers. This photo/acid sensitive silsesquioxane polymer or copolymer may undergo a photo/acid catalyzed chemical transformation to form circuit patterns after lithographic patterning. When the first patternable low-k material 18 is a chemically amplified positive-tone patternable low-k material, it typically undergoes a de-protection reaction to render the exposed area soluble in a developer; when the first patternable low-k material 18 is a chemically amplified negative-tone patternable low-k material, it typically undergoes a cross-linking reaction (to itself or through an additional cross-linker) to render it insoluble in a developer in the exposed regions during lithographic processing. Therefore, integrated circuit patterns can be generated during standard semiconductor lithography process. Furthermore, these integrated circuit patterns maintain their pattern integrity during the post patterning cure process to convert the patternable low-k material from a resist into a low-k material. Examples of such photo/acid sensitive silsesquioxane polymers or copolymers include poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyphydroxy-alpha-methylbenzylsilsesquioxane-co-p-hydroxy-benzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptyl-silsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS). In one embodiment, the patternable low-k dielectric material 18 is a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the first patternable low-k material 18 is a patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In one embodiment, the first patternable low-k material 18 is a patternable composition comprising a silsesquioxane polymer. It may be linear, branched, caged compound or combinations thereof having the following general structural formula:

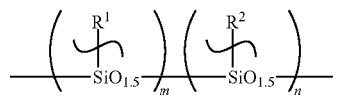

where, m and n represent the number of repeating units, $R^1$ represents a group which may comprise one or more functional groups which may provide polymer solubility in an aqueous base and provide functional groups for cross-linking, and $R^2$ represents a group which may comprise a carbon functionality which may control polymer dissolution rate in an aqueous base and/or an imaging function for positive-tone or negative-tone patterning. Subscripts m and n may be integers in the range from 0 to 50000, such as 1 to 5000 for example. $R^1$ may not be the same as $R^2$.

$R^1$ is not limited to any specific functional group, and may comprise functional groups which are substituted with —OH groups, —C(O)OH groups, —F, or combinations thereof, $R^1$ may comprise linear or branched alkyls, cycloalkyls, aromatics, arenes, or acrylics. For example, $R^1$ may be:

or the like.

$R^2$ is not necessarily limited to any specific functional group, and may comprise hydrogen, or linear or branched alkyls, cycloalkyls, aromatics, arenes, acrylates, or combinations thereof. For example $R^2$ may be:

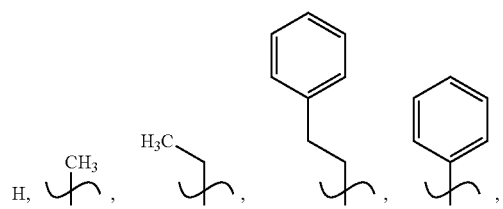

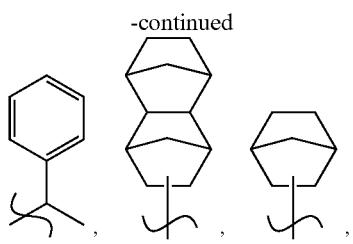

or the like.

The $R^1$ and $R^2$ proportions and structures may be selected to provide a material suitable for photolithographic patterning processes.

In one embodiment, the first patternable low-k material 18 is a negative-tone patternable low-k dielectric material comprising a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. The polymers in the blend may be miscible with each other. The first polymer or copolymer of the polymer blend has been described above.

In some instances, the second polymer of the polymer blend of this embodiment may comprise a polymer of one monomer or a copolymer including at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer at least two monomers selected from siloxane, silane, silsesquioxane, carbosilane, or oxycarbosilane moieties. In another embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred second polymers of the polymer blend are copolymers derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the second polymer of the polymer blend is a silsesquioxane polymer comprising a polymer having the structural formula:

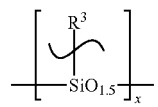

wherein $R^3$ may be a functional group comprising alkyls, cycloalkyls, aryl, or combinations thereof, and wherein x represents the number of repeating units and may be an integer in a range from 4 to 50000. For example, $R^3$ may be:

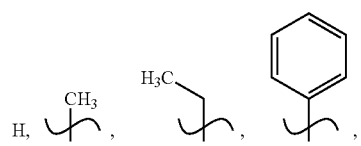

or the like.

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these.

In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The second silsesquioxane polymers or copolymers in the polymer blend may have a weight averaged molecular weight in the range from 200 to 5,000,000 g/mol, such as from 1500 to 10,000 g/mol, for example.

In another embodiment, the first patternable low-k material 18 is a negative-tone patternable low-k material comprising a carbosilane-substituted silsesquioxane polymer that may be a linear, branched, caged compound or a combination thereof, having the following general structural formula:

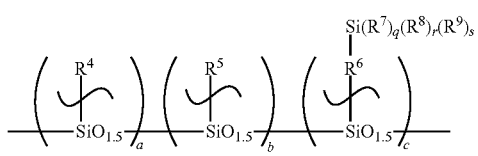

where, a, b, and c represent the number of each of the repeating units, $R^4$, $R^5$, $R^6$, $R^7$, and $R^8$ are carbon-containing groups, and $R^9$ is an alkoxy group. $R^6$, $R^7$ and $R^8$ may each independently represent a hydrocarbon group comprising 1 to 6 carbon atoms.

$R^4$, $R^5$, $R^6$, $R^7$, $R^8$, $R^9$ may be non-identical groups. Subscripts a, b, and c represent the number of repeating units in the polymer chain. Subscripts q and r may be integers in a range from 0 to 3. Subscript s may be an integer in a range from 1 to 3. Subscripts a and c may be integers greater than zero. For example a and c may each independently be in a range from 1 to 5,000. Subscript b may be an integer greater than or equal to zero. For example, b may be an integer in a range from 0 to 5,000.

$R^4$ may represent a group which comprises one or more functional groups which provide polymer solubility in an aqueous base and functional groups for a cross-linking reaction. Each instance of $R^4$ is not limited to any specific functional group, and may comprise a functional group which is substituted with one or more —OH groups, —C(O)OH groups, —F, or combinations thereof. $R^4$ may comprise linear or branched alkyls, cycloalkyls, aromatics, arenes, or acrylics. Examples of $R^4$ include:

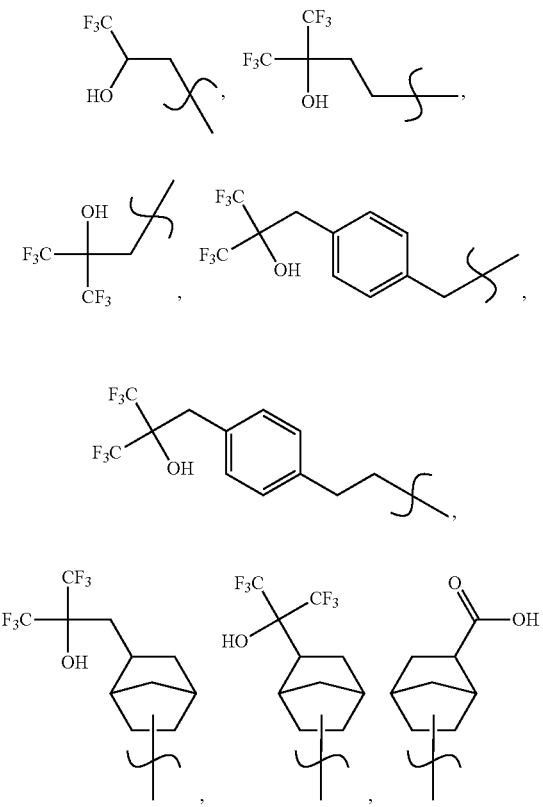

or the like.

$R^5$ may represent a group which comprises a carbon functionality comprising at least one carbon atom, where the carbon functionality controls polymer dissolution of the polymer into an aqueous base. The structure (e.g., size, chain length, etc.) of $R^5$ may affect the dissolution rate of the polymer into an aqueous base. Balancing of the dissolution-controlling group, $R^5$, with the solubility and cross-linking controlling group, $R^4$, allows properties such as dissolution rate and aqueous base solubility to be appropriately adjusted. $R^5$ is not necessarily limited to any specific functional group, and may comprise linear or branched alkyls, cycloalkyls, aromatics, arenes, acrylates, or combinations thereof. Examples of $R^5$ include:

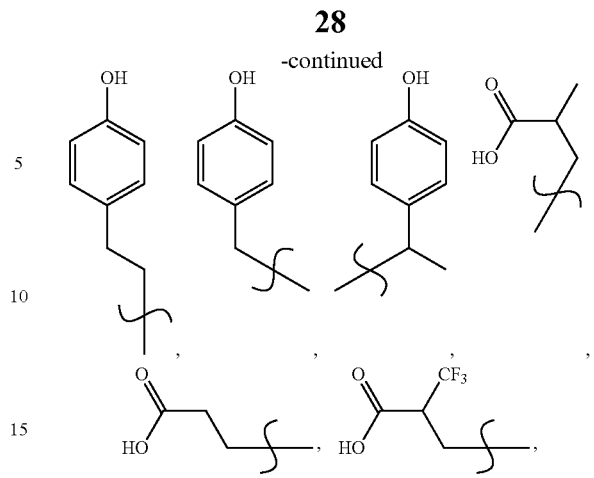

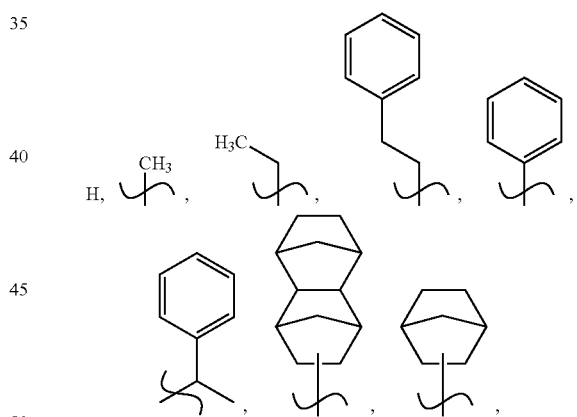

or the like.

$R^6$ is not limited to any specific alkoxy group. Examples of $R^6$ include linear or branched alkoxys, cycloalkoxy, and acetoxy groups.

The specific proportions and structures of $R^4$, $R^5$, and $R^6$ may be selected to provide a material suitable for photolithographic patterning processes.

In another embodiment, the first patternable low-k material 18 is a negative-tone patternable low-k material comprising a polymer blend of a first polymer or copolymer and a second polymer or copolymer wherein the first polymer is the carbosilane-substituted silsesquioxane polymer described above and the second polymer is polymer of one monomer or a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred second polymers of the polymer blend are copolymers derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the negative-tone carbosilane-substituted silsesquioxane patternable low-k composition may be a patternable composition comprising a polymer blend of a first polymer and a second polymer wherein the first polymer is the carbosilane-substituted silsesquioxane polymer described above and the second polymer of the polymer blend is a silsesquioxane polymer comprising a polymer having the structural formula:

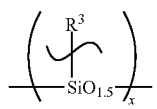

wherein $R^3$ may be a functional group comprising alkyls, cycloalkyls, aryl, or combinations thereof, and wherein x represents the number of repeating units and may be an integer in a range from 4 to 50000. For example, $R^3$ may be:

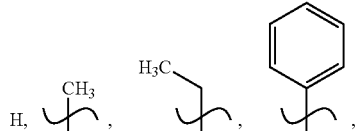

or the like.

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The silsesquioxane polymers representing the second polymer of the polymer blend described for this embodiment may have a weight averaged molecular weight in the range from 200 grams/mole (g/mol) to 500,000 g/mol, such as from 1500 g/mol to 10,000 g/mol, for example.

In another embodiment, compositions containing a blend of at least two of any combination of a silsesquioxane polymer and/or a silsesquioxane copolymer are employed. The silsesquioxane polymer or copolymer in the blend may be selected from the silsesquioxane polymers or copolymers described above or may be selected from other silsesquioxane polymers or copolymers such as, for example, poly(methylsilsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyphydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzyl-silsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glyeidyloxypropyl)dimethylsilyloxy)silsesquioxane, octakis[cyclohexenyl epoxide) dimethylsilyloxy]silsesquioxane, octakis[4-(hydroxyphenylethyl)dimethylsilyloxy]silsesquioxane, and octakis[{2-(1',1'-bis(trifluoromethyl)-1'-hydroxyethyl) norbornyl}dimethylsilyloxy]silsesquioxane. If desired, a combination of different Si-containing polymers may be used in the blend with the non-Si-containing polymers, such as a pore generator.

In yet another embodiment, the first patternable low-k material 18 is a patternable composition comprising a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In a preferred embodiment for negative-tone patternable low-k materials, two miscible, or compatible, silsesquioxanes are employed. The first silsesquioxane polymer or copolymer is a linear, branched, caged compound or combination thereof having the following structural formula:

wherein each occurrence of $R^{10}$ is one or more acidic functional groups for base solubility and provides functional groups for cross-linking; each occurrence of $R^{11}$ is a carbon functionality for controlling polymer dissolution rate in an aqueous base; $R^{10}$ is not equal to $R^{11}$; j and k represent the number of repeating units; j is an integer; and k is zero or an integer greater than zero.

$R^{10}$ is not limited to any specific functional group, and is preferably selected from among linear or branched alkyls which are substituted with OH, C(O)OH, and/or F;

cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R^{10}$ include:

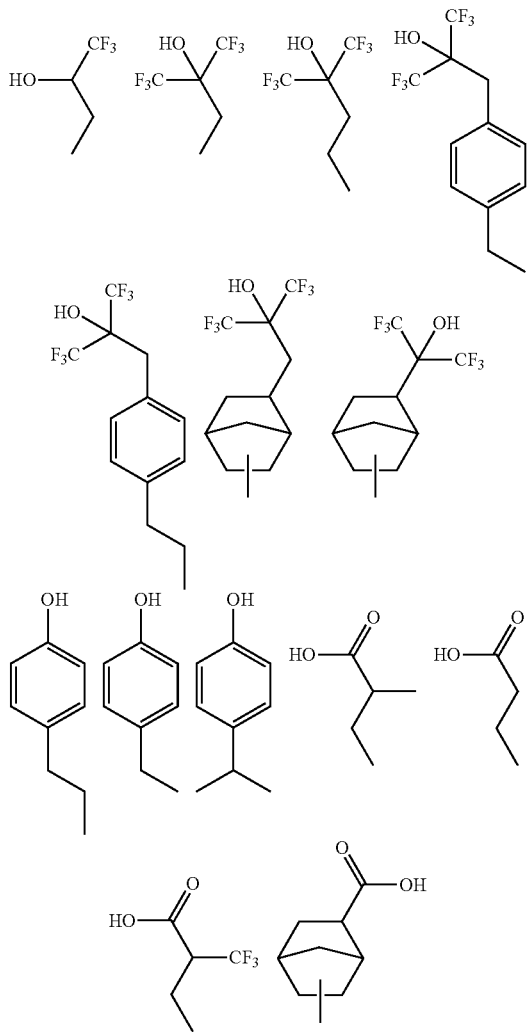

$R^{11}$ is not limited to any specific carbon functional group, and is preferably selected from among linear or branched alkyls, cycloalkyls, aromatics, arenes, and acrylates.

The silsesquioxane polymers or copolymers of this embodiment have a weight averaged molecular weight of 400 to 500,000, and preferably from 1500 to 10,000. The $R^{10}$ and $R^{11}$ proportions and structures are selected to provide a material suitable for photolithographic processes.

A second polymer component of the blend material includes but is not limited to a family of organosilicates known as silsesquioxanes having the structural formula:

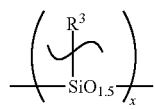

wherein $R^3$ may be a functional group comprising alkyls, cycloalkyls, aryl, or combinations thereof, and wherein x represents the number of repeating units and may be an integer in a range from 4 to 50000. For example, $R^3$ may be:

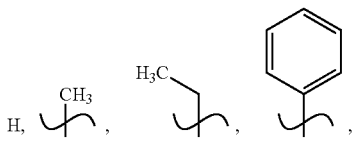

or the like.

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself; or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

A third component of a negative-tone patternable low-k composition is a photosensitive acid generator (PAG). Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers or copolymers in the blend formulation is 1 to 99% of the total polymer composition. In a preferred embodiment, the composition of the acid sensitive polymer is 20 to 80% of the total polymer composition, and even more preferred, 30 to 60%.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers or copolymers.

The first patternable low-k material 18 also typically includes a casting solvent to dissolve the other components.

Examples of suitable casting solvent include but are not limited to ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkylammonium hydroxides, cetyltrimethylammonium hydroxide, and 1,8-diaminonaphthalene. The compositions are not limited to any specific selection of base.

In yet another embodiment, the first patternable low-k material 18 is a chemically amplified positive-tone patternable low-k material comprising a silicon-containing polymer. The silicon-containing polymer employed may be a homopolymer or a copolymer. Suitable types of such silicon-containing polymers include a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Highly preferred silicon-backbone polymers are selected from the group consisting of poly(hydroxyphenyl alkyl)silsesquioxanes and poly(hydroxyphenyl alkyl) siloxanes, wherein the alkyl is a $C_{1-30}$ moiety. These preferred silicon-containing polymers are preferably fully or partially protected with acid-sensitive protecting groups.

In one embodiment, the first patternable low-k material 18 is a chemically amplified positive-tone patternable low-k material comprising a polymer of one monomer or a copolymer of at least two monomers wherein a silicon-containing substituent is chemically bonded to the monomer of the polymers or copolymers. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsesquioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

When the first patternable low-k material 18 is a positive-tone patternable low-k dielectric material comprising copolymers, the extent of protection and the amount of co-monomer present are such that the patternable low-k material resist composition will provide good lithography performance, i.e., high resolution and good process window. It should also maintain pattern integrity after post cure processing patterning. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to benzyl ether and t-alkyl ethers such t-butyl ether. Of the aforesaid ethers, it is highly preferred to use t-butyl ether.

Examples of cyclic and branched esters that can be employed are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed include, but are not limited to phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed include, but are not limited to: trimethylsilylether, dimethylethylsilylether and dimethylpropylsilylether. Of these silylethers, it is preferred that trimethylsilylether be employed.

In one embodiment, the first patternable low-k material 18 is a positive-tone patternable low-k dielectric material comprising a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. The polymers in the blend may be miscible with each other. The first polymer or copolymer of the polymer blend has been described above.

In one embodiment, the first patternable low-k material 18 is a positive-tone patternable low-k material comprising a polymer blend of at least two silsesquioxane polymers or copolymers. The polymers or copolymers in the blend may be miscible with each other. The first silsesquioxane polymer or copolymer may be linear, branched, caged compound or combinations thereof having the following general structural formula:

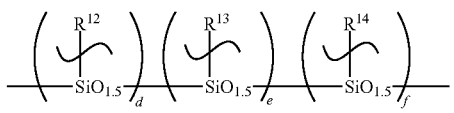

where, d, e and f represent the number of each of the repeating units, $R^{12}$ represents a carbon functionality (the carbon functionality comprising at least one carbon atom) having an acid-labile protecting group, $R^{13}$ represents a group which may comprise one or more functional groups which provide polymer solubility in aqueous base, and $R^{14}$ represents a group which may comprise a carbon functionality comprising at least one carbon atom, where the carbon functionality controls polymer dissolution rate of the polymer blend into aqueous base. $R^{12}$, $R^{13}$, and $R^{14}$ may be non-identical groups. Subscripts d, e, and f represent the number of repeating units. Subscripts d and f may be integers greater than zero. For example d and f may each independently be in a range from 1 to 5,000. Subscript e may be an integer greater than or equal to zero. For example, e may be an integer in a range from 0 to 5,000.

$R^{12}$ is not limited to any specific carbon functional group, and may be selected from among conventional acid sensitive protecting groups, such as carbonates, tertiary esters, acetals, ketals, the like, and combinations thereof. For example, the acid sensitive protecting group may comprise a tert-butylacetate group, where $R^{12}$ may be:

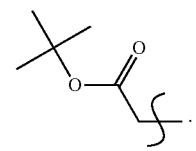

$R^{13}$ is not limited to any specific functional group, and may comprise functional groups which are substituted with —OH groups, —C(O)OH groups, —F, or combinations thereof. $R^{13}$ may comprise linear or branched alkyls, cycloalkyls, aromatics, arenes, or acrylics. For example, $R^{13}$ may be:

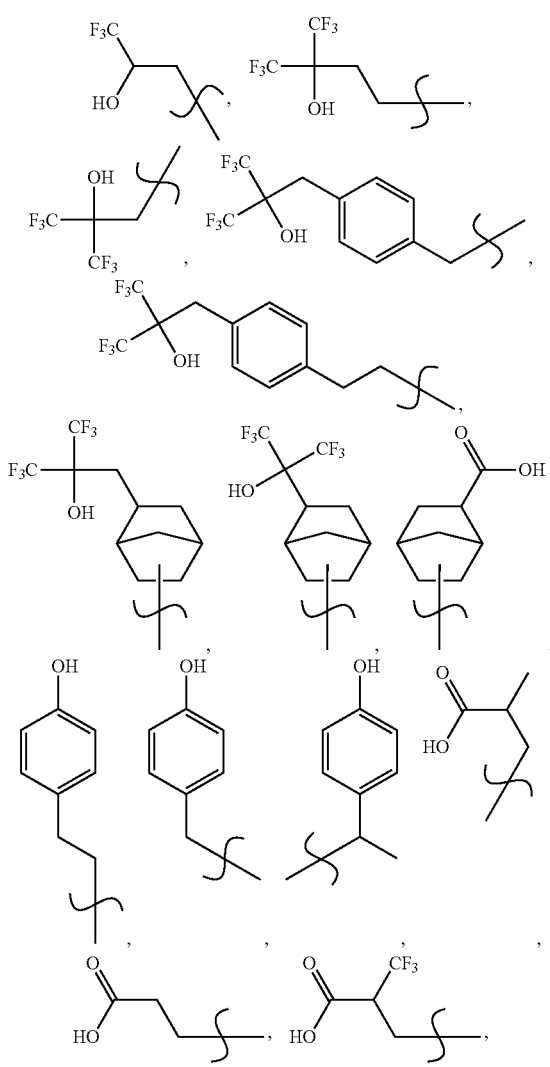

or the like.

$R^{14}$ is not necessarily limited to any specific functional group, and may comprise linear or branched alkyls, cycloalkyls, aromatics, arenes, acrylates, or combinations thereof. For example $R^{14}$ may be:

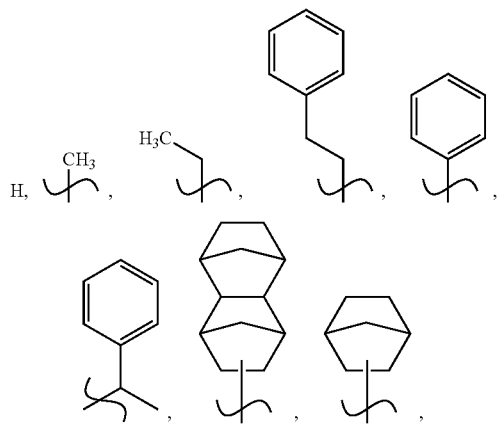

or the like.

The specific proportions and structures of $R^{12}$, $R^{13}$, and $R^{14}$ may be selected to provide a material suitable for photolithographic patterning processes.

In one embodiment, the second polymer of the polymer blend of this embodiment of positive-tone patternable low-k material may comprise a polymer of one monomer or a copolymer including at least two monomers and wherein the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methylmethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the second polymer in the polymer blend for the positive-tone patternable low-k material is a polymer having the structural formula:

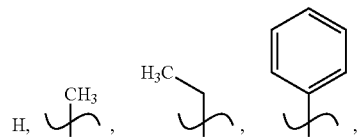

where $R^3$ may be a carbon functional group having at least one carbon atom and wherein the subscript x represents the number of repeating units and may be an integer greater than zero. The subscript q may be in a range from 4 to 50,000, such as from 10 to 1,000 for example. $R^3$ may comprise, for example, alkyls, cycloalkyls, aryl, or combinations thereof. Examples of $R^3$ include:

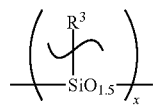

or the like.

In one embodiment, the second silsesquioxane polymer may be poly(methylsilsesquioxane) or copolymer, where $R^3$ is a methyl group, and x is an integer from 4 to 1,000. In another embodiment, x may be greater than 1,000. The second silsesquioxane polymer may also comprise a copolymer with siloxane, silane, carbosilane, oxycarbosilane, alkyltrialkoxysilane, or tetra-alkoxysilane. The second silsesquioxane polymer or copolymer structure may be caged, linear, branched, or combinations thereof. The silsesquioxane polymers of the present invention may comprise end groups comprising silanols, halosilanes, acetoxysilanes, silylamines, alkoxysilanes, and combinations thereof, which may undergo condensation reactions in the presence of an acid generated by a photoacid generator under exposure to radiation, followed by thermal baking. Polymer molecules of the second polymer may undergo chemical crosslinking with molecules of the first polymer or copolymer, the second polymer or copolymer, or a combination of these. In one embodiment of the present invention, the second silsesquioxane may be the silsesquioxane polymer or copolymer LKD 2021, LKD-2056 or LKD 2064 (products of JSR Corporation) which contain silanol end groups.

The silsesquioxane polymers or copolymers in the polymer blend may have a weight averaged molecular weight in the range from 400 to 500,000 g/mol, such as from 1500 to 10,000 g/mol, for example.

Other components of a positive-tone patternable low-k material include a photo acid generator, a casting solvent and a base additive. These components and their compositions are well known to those skilled in the art and are similar to those in the negative-tone patternable low-k materials discussed previously.

The term "photo/acid-sensitive" is used throughout the application to denote imageable functional groups which undergo a chemical reaction in the presence of an acid generated by a photoacid generator under exposure to radiation. The acid-sensitive imageable functional groups employed may include acid-sensitive positive-tone functional groups or acid-sensitive negative-tone functional groups. The negative-tone acid-sensitive functional groups are functional groups for effecting a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development. As such, the patternable low-k material can be patterned with the standard lithography tool set.

The aforementioned patternable low-k materials act as a photoresist during patterning; they can be positive-tone or negative-tone, and sensitive to G-line, I-line, DUV (248 nm, 193 nm, 157 nm, 126 nm, and EUV (13.4 μm), an electron beam, or an ion beam. The patterning by exposure with light through a mask can be in a dry mode or an immersion mode wherein a liquid with a refractive index larger than that of air is inserted between the patternable low-k and the lens of the exposure tool. The patterning of the patternable low-k material may be accomplished with a single exposure or more than one exposure to form the desired pattern.

In one preferred embodiment, a positive-tone patternable low-k material 18 is used for via patterning. Either a positive-tone or a negative-tone patternable low-k material 18 is used for line patterning.

Figure 3:
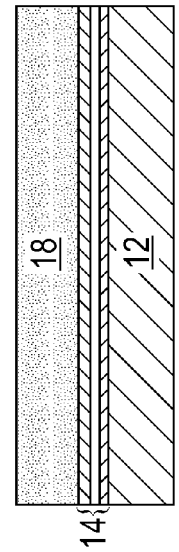
FIG. 3 is a pictorial representation (through a cross sectional view) of the structure shown in FIG. 2 after formation of a via pattern within the first patternable low-k material.

Referring to FIG. 3, the first patternable low-k material 18 is pattern-wise exposed to form latent images of a desired circuitry. An optional post-exposure baking may be required to effect the photochemical reactions. When performed, the baking step is conducted at a temperature from 60° to 200° C., with a baking temperature from 80° to 140° C. being even more preferred. The duration of the baking step varies and is not critical to the practice of the present invention. After exposure and post-exposure baking, the latent images are developed into the relief images with an appropriate developer, usually an aqueous base solution, such as 0.26N tetramethylammoniahydroxide (TMAH) solution.

The pattern wise exposing process can be accomplished in a variety of ways, including, for example, through a mask with a lithography stepper or a scanner with an exposure light source of G-line, I-line (365 nm), DUV (248 nm, 193 mm, 157 nm, 126 nm), Extreme UV (13.4 nm), or an electron beam, an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

FIG. 3 specifically illustrates the structure that is formed after forming first interconnect patterns 20 within the patternable low-k material film 18. The first interconnect patterns 20 may include at least one via opening (as shown and as preferred) or at least one line opening (not shown and less preferred than forming a via opening at this stage of the inventive method). As shown, the first interconnect patterns expose a surface of the graded cap layer 14.

After forming the first interconnect patterns, the patternable low-k material 18 is typically, but not necessarily always, cured to form a cured low-k material 18' (See, FIG. 3). The curing is optional when the first patternable low-k material is negative-tone, but it is required when the first patternable low-k material is a positive-tone material. Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patternable low-k material into a low-k film and maintains pattern fidelity.

In another embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He, Ar. Typically, the UV/thermal cure temperature is from 100° C. to 500° C., with a cure temperature from 300° to 450° C. being more typical. The duration of the UV/thermal cure is from 0.5 min to 30 min with a duration from 1 to 10 min being more typical. The UV cure module is designed to have a very low oxygen content to avoid degradation of the resultant dielectric materials. This post-patterning cure, if performed, may be in different or the same tool cluster as that of the patterning step.

Figure 4:
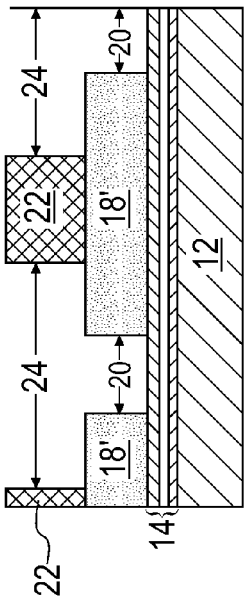
FIG. 4 is a pictorial representation (through a cross sectional view) of the structure shown in FIG. 3 after forming a second patternable low-k material over the entire surface of that structure.

After patterning and optionally curing the first patternable low-k material 18, a second patternable low-k material 22 is formed providing the structure shown in FIG. 4. The second patternable low-k material 22 may comprise the same or different material as the first patternable low-k material 18. In general terms, the nature, the composition, and method of formulation mentioned above for the first patternable low-k material 18 are each applicable here for the second patternable low-k material 22. The deposition processes and thickness mentioned above for the first patternable low-k material 18 are also each applicable here for the second patternable low-k material 22. Typically, and in the embodiment illustrated, the first patternable low-k material 18 or the second low-k material 22 is either a negative-tone or a positive-tone material.

Figure 5:
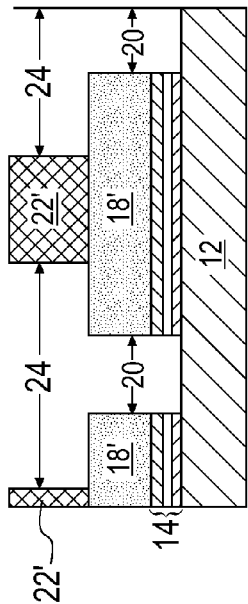
FIG. 5 is a pictorial representation (through a cross sectional view) of the structure shown in FIG. 4 after forming a trench pattern within the second patternable low-k material and recovering the via within the first patternable low-k material.

Referring now to FIG. 5, the second patternable low-k material 22 is patterned to include second interconnect patterns 24. The patterning of the second patternable low-k material 22 is performed utilizing the same basic processing equipment, steps and conditions as those used for patterning the first patternable low-k dielectric material 18. In the illustrated embodiment, the second interconnect pattern 24 is typically a line (trench). The via pattern formed within the first patternable low-k material and subsequently filled when the second patternable low-k material is form is also recovered. The second interconnect pattern 24 may also be a via, when the first interconnect pattern is a line.

Figure 6:
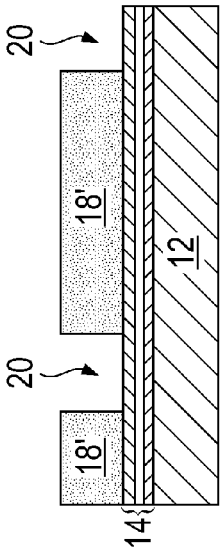
FIG. 6 is a pictorial representation (through a cross sectional view) of the structure shown in FIG. 5 after curing of the patterned first and patterned second patternable low-k materials and opening of the graded cap layer.

After patterning the second patternable low-k material 22, the structure is cured providing the structure shown in FIG. 6. In FIG. 6, reference numeral 22' denotes the cured second low-k material. Like the first cured low-k material 18', the cured second low-k material 22' has a relative dielectric constant usually less than 4.3. If not previously cured, this curing step also cures the first patternable low-k material 18 into a cured low-k material 18'. The cure methods, equipment and processes mentioned above for the first patternable low-k material 18 are each applicable here for the second patternable low-k material 22.

Still referring to FIG. 6, an etching step is performed that etches through the graded cap layer 14. The etching step to 'open' the graded cap layer 14 includes any etching process such as, for example, reactive ion etching or gas cluster ion beam etching.

A diffusion barrier layer (liner) (not shown), which may comprise Ta, TaN, Ti, TiN, Ru, RuTaN, RuTa, W, WN or any other material that can serve as a barrier to prevent electrically conductive material from diffusing through, is typically formed into the first and second interconnect patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 7 to 20 nm being more typical.

Following the formation of the diffusion barrier layer (liner), the remaining region of the first and second interconnect patterns is filled with an electrically conductive material 26 forming a conductive feature. The conductive material 26 used in forming the conductive feature includes, for example, polySi, an electrically conductive metal, an alloy comprising at least one electrically conductive metal, an electrically conductive metal silicide, an electrically conductive nanotube or nanowire, graphene or combinations thereof. Preferably, the conductive material 26 that is used in forming the conductive feature is a conductive metal such as Cu, W or Al, with Cu or a Cu alloy (such as AlCu) being highly preferred in the present invention. The conductive material 26 is filled into the remaining first and second interconnect patterns utilizing a conventional deposition process including, but not limited to CVD, PECVD, sputtering, chemical solution deposition or plating. A preferred filling method is electrochemical plating.

After deposition, a conventional planarization process such as, for example, chemical mechanical polishing (CMP) can be used to provide a structure in which the diffusion barrier layer and the conductive material 26 each have an upper surface that is substantially coplanar with the upper surface of the cured second low-k material 22'. The resultant structure after filling the openings in the cured first and second low-k materials and planarization is shown, for example, in FIG. 7.

Figure 7:
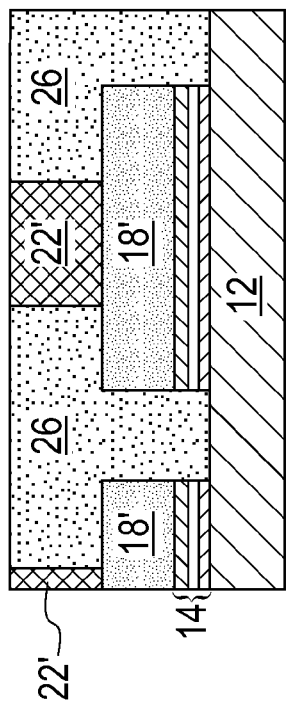
FIG. 7 is a pictorial representation (through a cross sectional view) of the structure shown in FIG. 6 after conductive fill and planarization.
Figure 8:
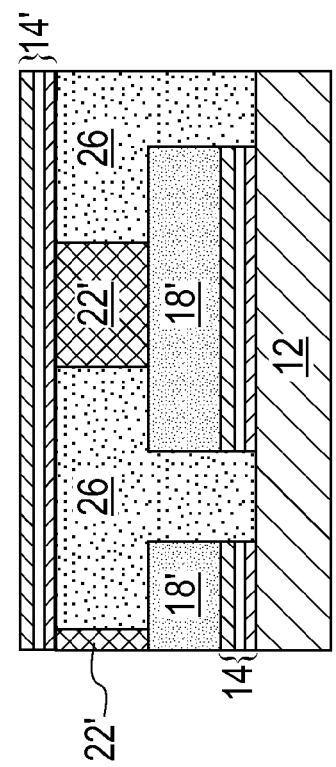
FIG. 8 is a pictorial representation (through a cross sectional view) of the structure shown in FIG. 8 after forming another graded cap layer atop the exposed surfaces thereof.

After forming the at least one conductive material 26 and planarization, another graded cap 14' can be formed on the surface of the cured second low-k material 22'. The structure including another graded cap layer 14' is shown in FIG. 7. This graded cap 14' can be formed utilizing the methods described above and graded cap 14 can comprise the same or different composition as graded cap 14. In addition, the graded cap 14' can be replaced by any conventional dielectric cap.

In some embodiments not illustrated, a block mask can be formed atop the graded (or conventional) cap 14' utilizing any conventional deposition process including, for example, CVD, PECVD and spin-on coating. The block mask can comprise a standard photoresist material including inorganic, organic and hybrid resists. The block mask can further comprise at least one anti-reflective coating layer and/or at least one hardmask layer. The composition of the anti-reflective coating layer and the hardmask layer can be organic, inorganic or organic/inorganic hybrid materials as long as the combination of their composition and layer thickness satisfies the patterning and pattern transfer needs of a subsequent airgap. In this particular embodiment, the graded cap 14' and block mask are patterned providing an airgap pattern therein. The patterning step includes optical lithography, immersion lithography, EUV, soft lithography, contact printing, nano-printing, E-Beam, maskless direct writing, scanning probe lithography, self-assemble lithography and directed self-assemble lithography. Note that the feature size of the airgap pattern is less than the dielectric spacing within the low-k materials. The patterning step also includes etching such as reactive-ion etching. The airgap pattern can be transferred into at least the second patterned and cured low-k material 22' utilizing a timed etching process such as, for example, reactive ion etching. After transferring the airgap pattern into the second patterned and cured low-k dielectric material 22', the airgap is formed with the second patterned and cured low-k dielectric material 22' selectively removing part of the second patterned and cured low-k dielectric material 22'. The remaining block mask is then removed from the structure utilizing a conventional removal method of sacrificial materials such as reactive ion etching, stopping atop the remaining graded cap 14'. In this embodiment, the transferred airgap pattern is adjacent to, but not directly abutting the conductively filled regions formed into at least patterned and cured second patternable low-k material. The airgap pattern may also be extended into the first patterned and cured patternable low-k material 18'.

Figure 9:
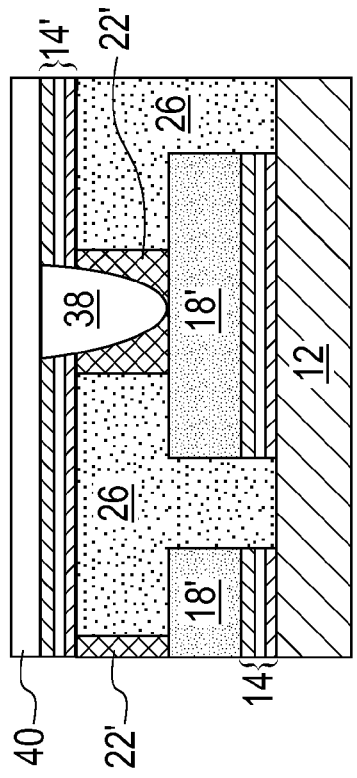
FIG. 9 is a pictorial representation (through a cross sectional view) of the structure shown in FIG. 9 after further processing in which at least one airgap is formed within the structure.

After transferring the airgap pattern into at least the patterned and cured second low-k material 22', portions of the low-k material that are directly abutting the airgap opening are changed physically, chemically or both so as to have a different removal rate as compared to the remaining low-k dielectric material. This change in removal rate is achieved in the present application, by a chemical treatment, exposure to a reducing or an oxidizing plasma. One preferred embodiment of this material transformation is by an isotropic reactive ion etching. The isotropic ion etching gas chemistry is selected from at least one of $O_2$, CO, $CO_2$, $N_2$, $H_2$, $NH_3$, He, Ar, hydrocarbon and the like. This changed portion of the low-k dielectric directly abutting the airgap opening is then removed utilizing an etching process such as, for example, an isotropic etch utilizing a dilute HF etchant. A supercritical fluid etching process may also be used in some embodiments of the invention. These two steps, e.g., changing the etch selectivity of portions of the patterned and cured low-k dielectric material and etching, provides an airgap within the structure. The airgap may include air or a vacuum. A pump may be used to remove the air from the airgap to form a vacuum. An airgap cap can be formed atop the remaining another cap layer 14' sealing the airgap in the structure. The airgap cap includes an ARC including a conventional inorganic ARC. FIG. 9 illustrates the interconnect structure of FIG. 8 after aircap 38 formation. FIG. 9 also shows airgap cap 40 atop the structure.

In addition to the dual-damascene embodiment mentioned above, the present invention also contemplates a single-damascene embodiment. The single-damascene structure includes the same basic processing steps as described above for the dual-damascene process except that a second patternable low k dielectric is not introduced into the process.

The following examples illustrate some aspects of the present invention.

Example 1

As summarized in the table below, five films were deposited onto silicon substrates at 400° C., high frequency rf power was varied between 300-460 Watts, and the pressure was varied between 3-8.7 torr. Trimethyl silane was selected as the carbon and silicon source, ammonia as the nitrogen source and He was used as a dilutent.

| Layer | TMS (sccm) | NH$_3$ (sccm) | He (sccm) | pressure | power |
|-------|------------|---------------|-----------|----------|-------|
| 1 | 80 | 160 | 200 | 3 | 300 |
| 2 | 160 | 160 | 240 | 8.7 | 460 |
| 3 | 160 | 100 | 300 | 8.7 | 460 |
| 4 | 160 | 50 | 350 | 8.7 | 460 |
| 5 | 160 | 0 | 400 | 8.7 | 460 |

The effect of varying trimethyl silane, ammonia flows was studied by FTIR (not shown). As shown in the FTIR spectra decreasing ammonia in the film decreases SiN and increases SiC, CH and SiH content in the film.

Example 2

Using the individual conditions from layer 1-5 in example 1, a graded layer was deposited. Deposition time was varied for each layer to optimize film thickness and properties.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
at least one patterned and cured low-k material located directly on a surface of a patterned graded cap layer, wherein said at least one patterned and cured low-k material and said patterned graded cap layer each have conductively filled regions embedded therein, wherein said patterned and cured low-k material is a cured product of a patternable composition comprising a functionalized polymer, copolymer, or a blend including at least two of any combination of polymers and/or copolymers having one or more photo/acid-sensitive imageable groups, and said patterned graded cap layer has a gradually varied composition along a vertical direction relative to an underlying substrate and comprises a lower region that functions as a barrier region and an upper region that has the properties of a permanent antireflective coating, wherein said lower region and said upper region are separated by at least one middle region, said at least one middle region including a combination of atoms present in both said lower region and said upper region.

2. The interconnect structure of claim 1 further comprising at least one airgap located within that at least one patterned and cured low-k material adjacent, but not directly abutting the conductively filled regions.

3. The interconnect structure of claim 1 wherein said lower region of the graded cap layer includes atoms of Si and C; atoms of Si and N; atoms of Si and O, atoms of Si, O and N; atoms of Si, C and O; atoms of Si, C, O and H; or atoms of Si, C, N and H.

4. The interconnect structure of claim 1 wherein said lower region of the graded cap layer comprises atoms of Ru, Co, W and P.

5. The interconnect structure of claim 1 wherein said graded cap layer has a thickness range from 2 nm to 200 nm.

6. The interconnect structure of claim 1 wherein said upper region comprises atoms of Si, C, O, N and H; atoms of Si and C; atoms of Si, O and C; atoms of Si, C, O and H; and atoms of W, Co, Ru, Ta, Ti, and Ru.

7. The interconnect structure of claim 1 wherein said upper region includes atoms of M, C and H, wherein M is selected from at least one atom of Si, Ge, B, Sn, Fe, Ta, Ti, Ni, Hf and La.

8. The interconnect structure of claim 7 further comprising at least one atom of O, N, S or F.

9. The interconnect structure of claim 1 wherein said upper region comprises a vapor deposited M:C:H film wherein M is selected from at least one atoms of Si, Ge, B, Sn, Fe, Ta, Ti, Ni, Hf and La.

10. The interconnect structure of claim 9 further comprising X, wherein is at least one atom of O, N, S or F.

11. The interconnect structure of claim 1 wherein said upper region comprises a polymer that has at least one monomer unit of the formula M-R$^A$ wherein M is at least one of the elements of Si, Ge, B, Sn, Fe, Ta, Ti, Ni, Hf and La, and R$^A$ is a chromophore.

12. The interconnect structure of claim 11 wherein M of the at least one monomer unit is bonded to an organic ligand selected from elements of C and H, a cross-linking component, another chromophore and mixtures thereof.

13. The interconnect structure of claim 11 further comprising another monomer unit, said another monomer unit having the formula M'-R$^B$, wherein M' is at least one of the elements of Si, Ge, B, Sn, Fe, Ta, Ti, Ni, Hf and La, and R$^B$ is a cross-linking component.

14. The interconnect structure of claim 11 wherein M and M' is bonded to an organic ligand selected from elements of C and H, a cross-linking component, another chromophore and mixtures thereof.

15. An interconnect structure comprising:
a lower patterned and cured low-k material located directly on a patterned graded cap layer and an abutting upper patterned and cured low-k material located on said lower patterned and cured low-k material, said lower and upper patterned and cured low-k materials and said patterned cap layer each having conductively filled regions, wherein said patterned and cured upper and lower low-k materials each are cured products of a same or different patternable composition comprising functionalized polymer, copolymer, or a blend including at least two of any combination of polymers and/or copolymers having one or more photo/acid-sensitive imageable groups, and said patterned graded cap layer has a gradually varied composition along a vertical direction relative to an underlying substrate and comprises a lower region that functions as a barrier region and an upper region that has properties of a permanent antireflective coating, wherein said lower region and said upper region are separated by at least one middle region, said at least one middle region including a combination of atoms present in both said lower region and said upper region.

16. An airgap-containing interconnect structure comprising:
a lower patterned and cured low-k material located directly on a patterned graded cap layer and an abutting upper patterned and cured low-k material located on said lower patterned and cured low-k material, said lower and upper patterned and cured low-k materials and said patterned cap layer each having conductively filled regions, wherein said patterned and cured upper and lower low-k materials each are cured products of a same or different patternable composition comprising functionalized polymer, copolymer, or a blend including at least two of any combination of polymers and/or copolymers having one or more photo/acid-sensitive imageable groups, and said patterned graded cap layer has a gradually varied composition along a vertical direction relative to an underlying substrate and comprises a lower region that functions as a barrier region and an upper region that has properties of a permanent antireflective coating, wherein said lower region and said upper region are separated by at least one middle region, said at least one middle region including a combination of atoms present in both said lower region and said upper region, and further wherein at least one airgap is located within the upper patterned and cured low-k material located adjacent, but not directly abutting the conductively filled regions.

* * * * *